(12) United States Patent
Chang et al.

(10) Patent No.: US 7,932,148 B2
(45) Date of Patent: Apr. 26, 2011

(54) PROCESSES FOR MANUFACTURING MOSFET DEVICES WITH EXCESSIVE ROUND-HOLE SHIELDED GATE TRENCH (SGT)

(75) Inventors: Hong Chang, Cupertino, CA (US); Sung-Shan Tai, San Jose, CA (US); Tiesheng Li, San Jose, CA (US); Yu Wang, Fremont, CA (US)

(73) Assignee: Alpha & Omega Semiconductor, Ltd (BM)

( * ) Notice: Subject to any disclaimer, the term of this patent is extended or adjusted under 35 U.S.C. 154(b) by 60 days.

(21) Appl. No.: 12/378,040

(22) Filed: Feb. 9, 2009

(65) Prior Publication Data

US 2009/0148995 A1 Jun. 11, 2009

Related U.S. Application Data

(62) Division of application No. 11/321,957, filed on Dec. 28, 2005, now Pat. No. 7,492,005.

(51) Int. Cl.
*H01L 21/336* (2006.01)
(52) U.S. Cl. .. 438/259; 438/283; 257/340; 257/E21.002
(58) Field of Classification Search ................. 438/259, 438/283; 257/340, E21.002
See application file for complete search history.

(56) References Cited

U.S. PATENT DOCUMENTS

| | | | | |
|---|---|---|---|---|
| 6,075,269 A | * | 6/2000 | Terasawa et al. | 257/330 |
| 6,150,210 A | * | 11/2000 | Arnold | 438/243 |
| 7,154,144 B2 | * | 12/2006 | Kim et al. | 257/328 |

* cited by examiner

*Primary Examiner* — Zandra Smith
*Assistant Examiner* — Christy L Novacek
(74) *Attorney, Agent, or Firm* — Bo-In Lin

(57) ABSTRACT

This invention discloses an improved trenched metal oxide semiconductor field effect transistor (MOSFET) device that includes a trenched gate surrounded by a source region encompassed in a body region above a drain region disposed on a bottom surface of a substrate. The MOSFET cell further includes a shielded gate trench (SGT) structure below and insulated from the trenched gate. The SGT structure is formed substantially as a round hole having a lateral expansion extended beyond the trench gate and covered by a dielectric liner layer filled with a trenched gate material. The round hole is formed by an isotropic etch at the bottom of the trenched gate and is insulated from the trenched gate by an oxide insulation layer. The round hole has a lateral expansion beyond the trench walls and the lateral expansion serves as a vertical alignment landmark for controlling the depth of the trenched gate. The MOSFET device has a reduced gate to drain capacitance Cgd depending on the controllable depth of the trenched gate disposed above the SGT structure formed as a round hole below the trenched gate.

10 Claims, 7 Drawing Sheets

PROCESSES FOR MANUFACTURING MOSFET DEVICES WITH EXCESSIVE ROUND-HOLE SHIELDED GATE TRENCH (SGT)

The patent application is a Divisional Patent Application and claims the Priority of a previously filed patent application Ser. No. 11/321,957 that was filed on Dec. 28, 2005 now U.S. Pat. No. 7,492,005 by the same inventors of this Patent Application.

BACKGROUND OF THE INVENTION

1. Field of the Invention

The invention relates generally to the semiconductor power devices. More particularly, this invention relates to an improved and novel manufacturing process and device configuration for providing the shielded trench gates having precisely controllable depth below the silicon top surface such that the reduction of gate to drain capacitance can be accurately achieved.

2. Description of the Prior Art

Conventional technologies for reducing the gate to drain capacitance Cgd in a DMOS device by employing the shielded gate trench (SGT) structure are still confronted with technical limitations and difficulties. Specifically, trenched DMOS devices are configured with trenched gates wherein large capacitance (Cgd) between gate and drain limits the device switching speed. The capacitance is mainly generated from the electrical field coupling between the bottom of the trenched gate and the drain. In order to reduce the gate to drain capacitance, an improved Shielded Gate Trench (SGT) structure is introduced at the bottom of the trenched gate to shield the trenched gates from the drain. The design concept of a SGT structure is link the bottom of the trench to the source such that the trenched gates are shielded from the drain located at the bottom of the substrate as that shown in FIG. 1. A reduction of gate to drain capacitance to about half of the original Cgd value can be achieved by implementing the SGT structure in the bottom of the trenched gates. The switching speed and switching efficiency of the DMOS devices implemented with the SGT structure at the bottom of the trenched gates are therefore greatly improved.

However, great cares are required in the manufacturing processes in order to achieve the Cgd improvement by implementing such architecture. A particular time-etch of the polysilicon from the bottom of the gate trenches must be accurately controlled. As shown in FIG. 1, the DMOS device supported on a substrate 10 provided with an epitaxial layer 15 has a trenched gate 20. The trenched gate 20 includes a polysilicon gate filled in the trenches with gate insulation layer 45. Under the trenched gate 20, a separated shielded gate trench (SGT) structure 30 is formed that includes polysilicon filling the trench bottom space separated from the trenched gate 20 with an insulation layer 40. The DMOS device further includes the body regions and source regions 50 and 60 as the standard DMOS devices. The depth of the bottom of the trenched gate, i.e., D as shown in FIG. 1, is dependent on the etch rate of the polysilicon from the top portion of the trench when forming the SGT structure 30. A carefully controlled time etch is carried out to control the depth D. However, the depth of the trench bottom D cannot be accurately controlled due to the variations of the etch speed of the polysilicon from the top portion of the trenches.

As described above, even with accurate time control of an etch process, the depth of the polysilicon gate relative to the top surface of the silicon substrate cannot be controlled with sufficient accuracy. Variations of the gate depth are difficult to control because of the facts that in addition to the length of etch time, the speed of polysilicon etch at the bottom of the trenched gates is also dependent on several parameters that can all cause variations of the depth of the trenched gates. However, the variations of the depth of the gate bottom directly impact the device performance including the gate to drain capacitance. The variations of the gate depth further impact the difficulties in controlling the device channels. The reduction of the gate to drain capacitances cannot be fully realized unless special cares are implemented to control the etch speed of polysilicon from the trench bottom in order to control the depth of the trenched gates.

Therefore, a need still exists in the art of power semiconductor device design and manufacture to provide new manufacturing method and device configuration in forming the power devices such that the above discussed problems and limitations can be resolved.

SUMMARY OF THE PRESENT INVENTION

It is therefore an object of the present invention to provide a new and improved semiconductor power device implemented with the shielded gate trench (SGT) structure that opened as a round hole with lateral expansion beyond the trench walls to provide as landmark of vertical alignment. The depth of the trenched gate can be accurately controlled with the lateral expansion as vertical alignment such that the gate to drain capacitance can be accurately manufactured to overcome the above discussed technical difficulties and limitations.

Specifically, it is an object of the present invention to provide improved device configuration and manufacturing method to reduce the gate to drain capacitance while accurately control the device parameters including the gate to drain capacitance by controlling the depth of the trenched gate. The depth of the trenched gate is controlled by forming a round hole SGT structure with lateral expansion from the trenches such that the depth of the trenched gate is accurately controlled by a time etch using the round hole lateral expansion as a control indication for vertical alignment.

Briefly in a preferred embodiment this invention discloses a trenched metal oxide semiconductor field effect transistor (MOSFET) cell that includes a trenched gate surrounded by a source region encompassed in a body region above a drain region disposed on a bottom surface of a substrate. The MOSFET cell further includes a shielded gate trench (SGT) structure below and insulated from the trenched gate. The SGT structure is formed substantially as a round hole having a lateral expansion extended beyond the trench gate and covered by a dielectric liner layer filled with a trenched gate material. The round hole is formed by an isotropic etch at the bottom of the trenched gate and is insulated from the trenched gate by an oxide insulation layer. The round hole has a lateral expansion beyond the trench walls and the lateral expansion serves as a vertical alignment landmark for controlling the depth of the trenched gate. The MOSFET device has a reduced gate to drain capacitance Cgd depending on the controllable depth of the trenched gate disposed above the SGT structure formed as a round hole below the trenched gate.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1:
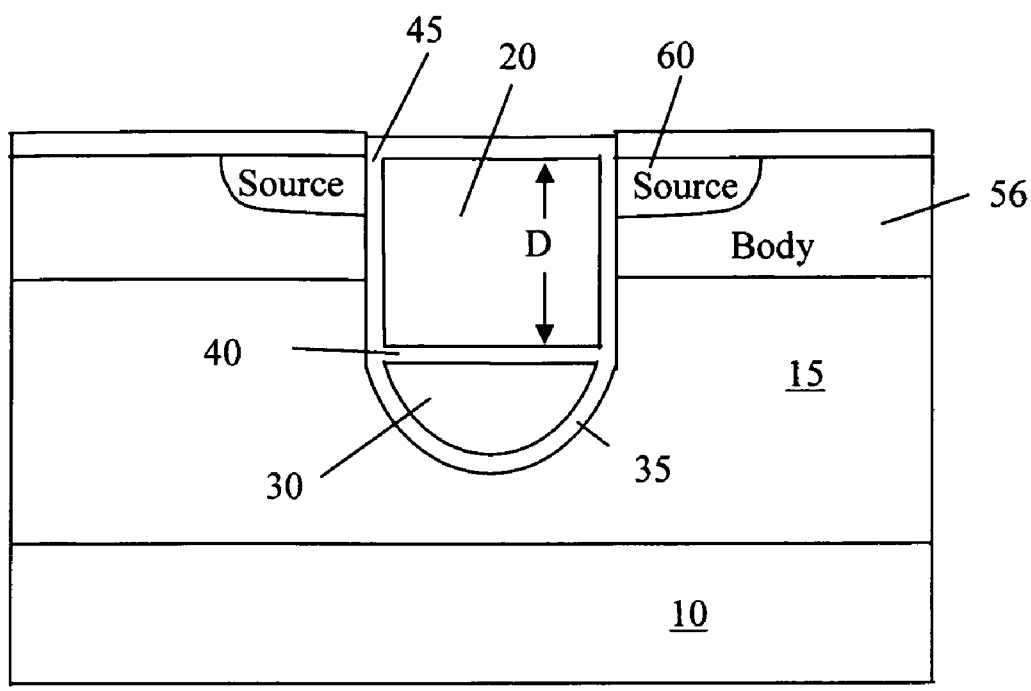
FIG. 1 is a cross sectional view of a conventional trenched MOSFET device implemented with a trenched gate configured with a conventional shielded gate trench (SGT) structure.
Figure 2:
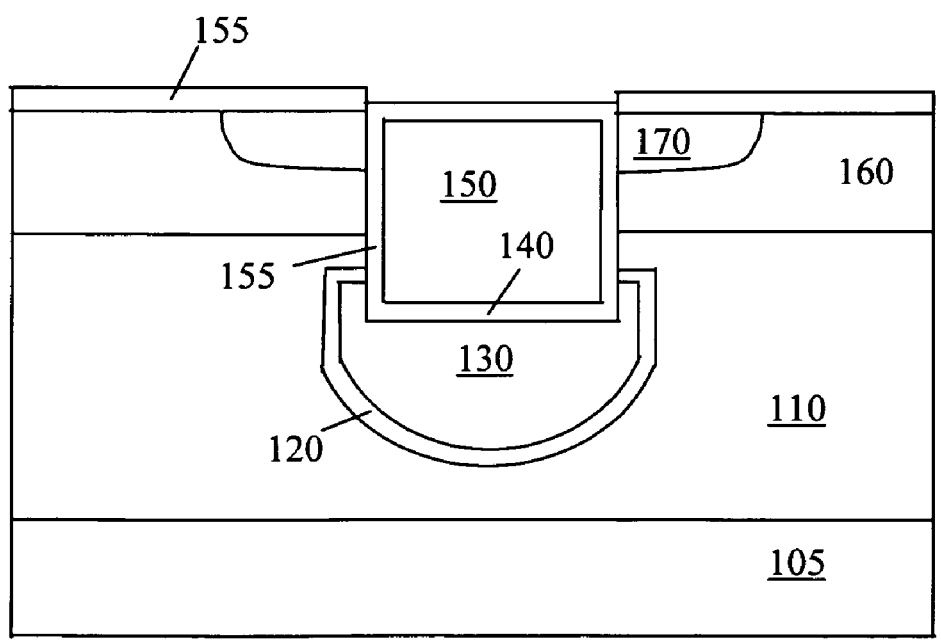
FIG. 2 is a cross sectional view of a trenched MOSFET device implemented with round hole SGT structure disposed under the trenched gate manufactured by the processes of this invention.

Referring to FIG. 2 for a cross sectional view of a trenched MOSFET device 100 of this invention. The trenched MOSFET device 100 is supported on a substrate 105 formed with an epitaxial layer 110. The trenched MOSFET device 100 includes a shielded gate trench (SGT) structure 130 opened as a round hole shielding structure below a trenched gate 150. The round hole SGT structure 130 filled with a polysilicon therein is provided to shield and insulate the trenched gate 150 from the drain disposed below the drain 105 by insulation layers 120 surrounding the SGT structure 130 and the oxide layer 140 between the SGT structure 130 and the trenched gate 150. The trenched gate 150 includes polysilicon filling in a trench surrounded with a gate insulation layer 155 covering the trenched walls. A body region 160 that is doped with a dopant of second conductivity type, e.g., P-type dopant, extends between the trenched gates 150. The P-body regions 160 encompassing a source region 170 doped with the dopant of first conductivity, e.g., N+ dopant. The source regions 170 are formed near the top surface of the epitaxial layer surrounding the trenched gates 150. On the top surface of the semiconductor substrate are also insulation layers, contact openings and metal layers for providing electrical contacts to the source-body regions and the gates. For the sake of brevity, these structural features are not specifically shown and discussed since these structures are already known to those of ordinary skill in the art.

Figure 3A:
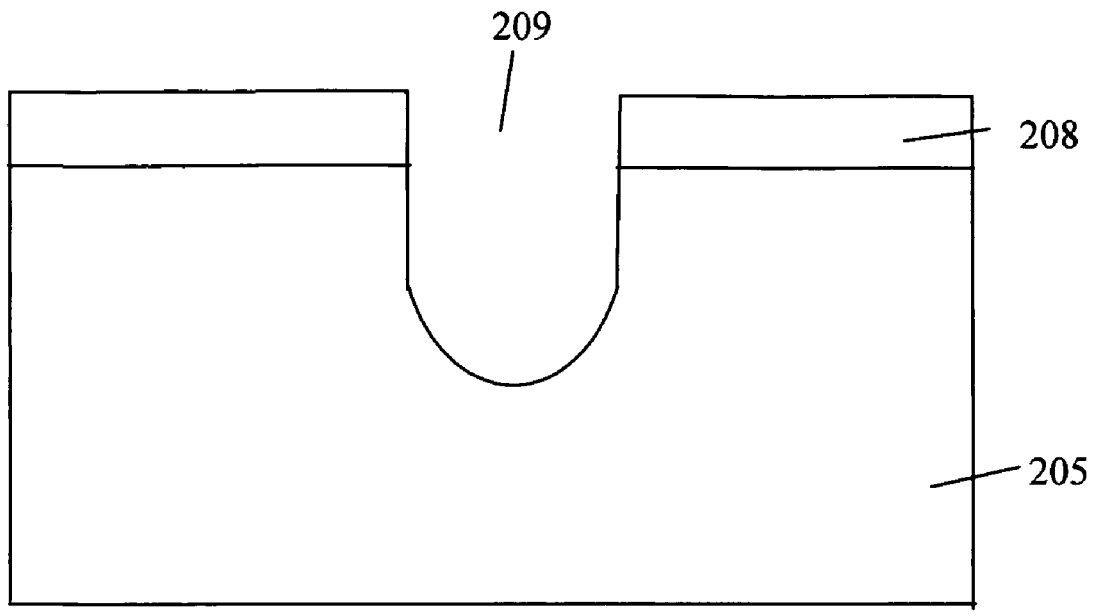
FIGS. 3A to 3L are a serial cross sectional views for describing the manufacturing processes to provide a trenched MOSFET device as shown in FIG. 2.
Figure 3B:
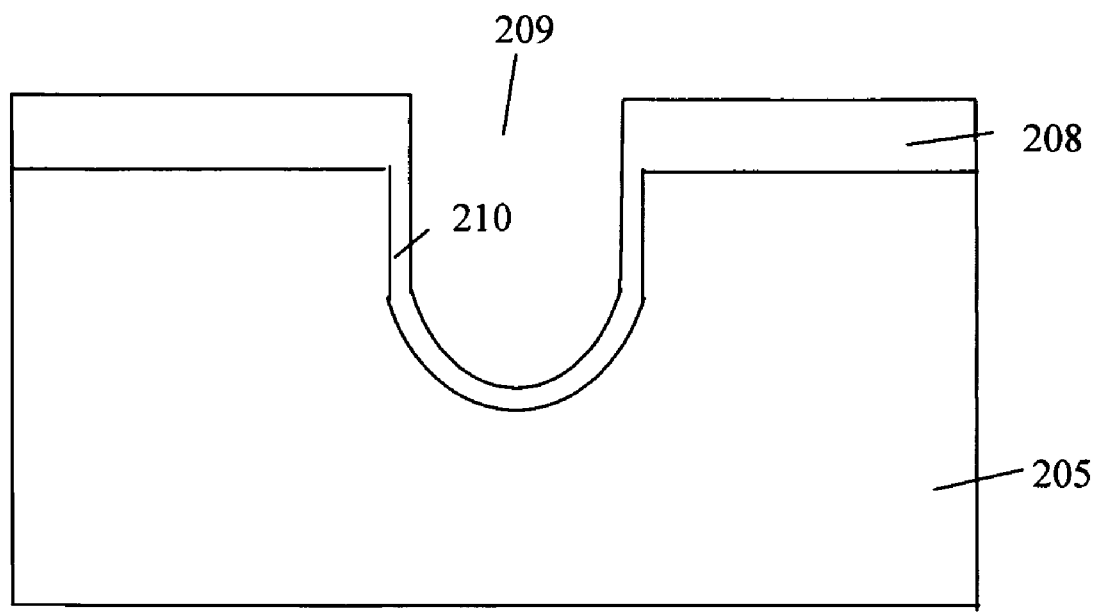
Figure 3C:
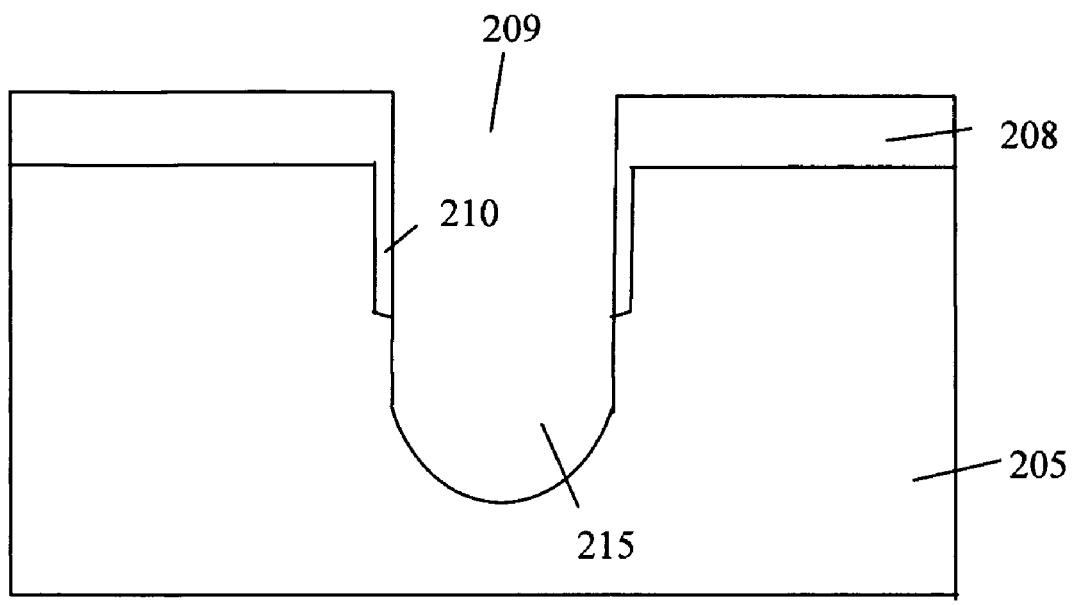
Figure 3D:
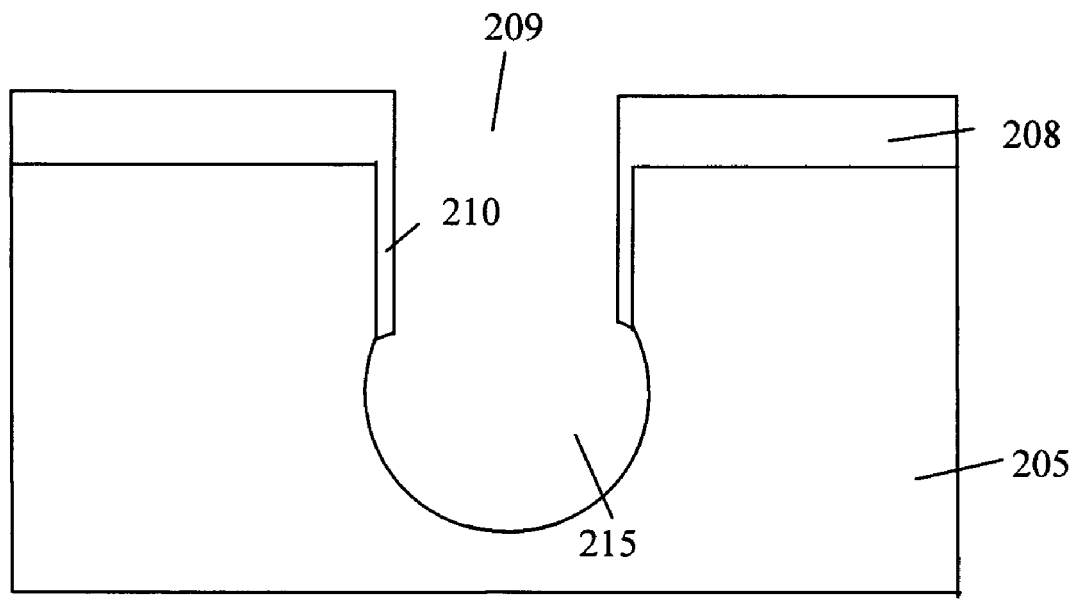
Figure 3E:
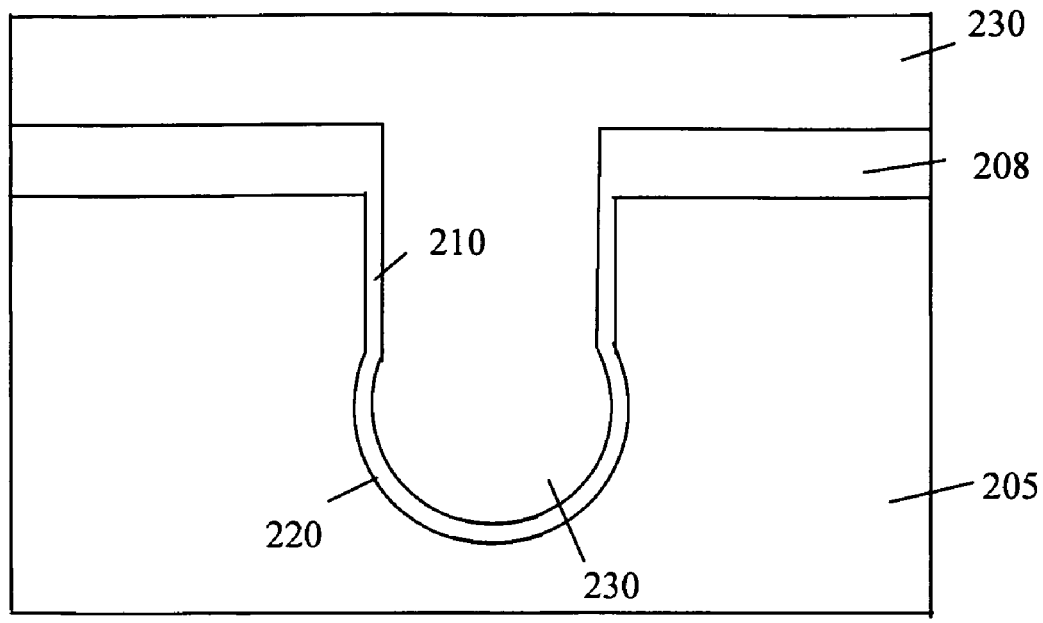

Referring to FIGS. 3A to 3L for a serial of side cross sectional views to illustrate the fabrication steps of a MOSFET device as that shown in FIGS. 2A to 2D. In FIG. 3A, a trench mask 208 is applied to open a plurality of trenches 209 on a substrate 205. In FIG. 3B, an oxide layer 210 is grown on the surface of the trench walls. In FIG. 3C, a non-isotropic oxide etch is carried out to remove the oxide layer 210 from the bottom of the trench walls. Then an anisotropic silicon etch is performed to etch down the trench 209 deeper into the substrate. A unique silicon round hole etch, i.e., an isotropic silicon etch, is carried out to open a round hole 215 to extend the bottom of the trench to the lateral direction and the vertical direction as that shown in FIG. 3D. The round holes at the bottom of the trenches extend laterally and the round hole 215 is wider than the top trench width that is protected by sidewall oxide 210. In FIG. 3E, a second trench oxidation is performed to form the oxide layer 220 on the sidewalls of the bottom trench hole 215. Then a polysilicon layer 230 is deposited to fill in the trenches 209 and the bottom round holes 215.

Figure 3F:
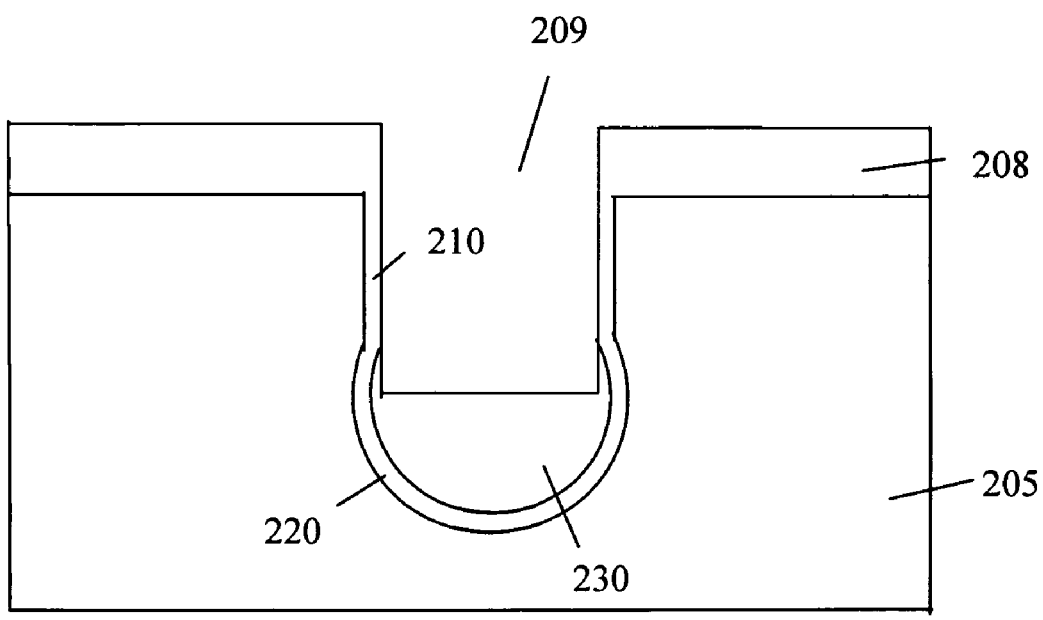
Figure 3G:
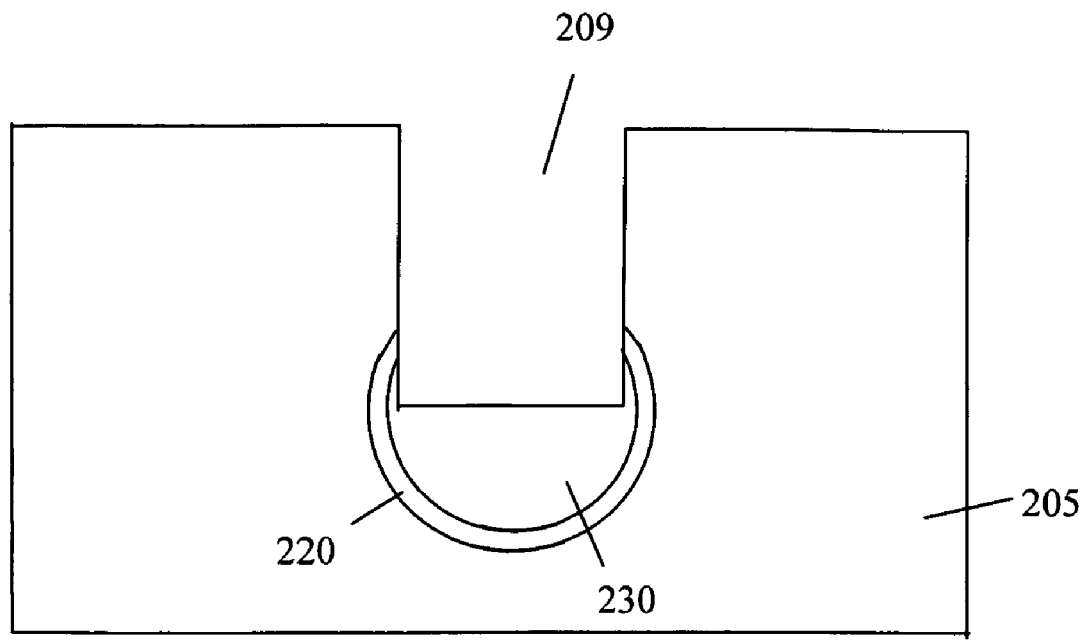
Figure 3H:
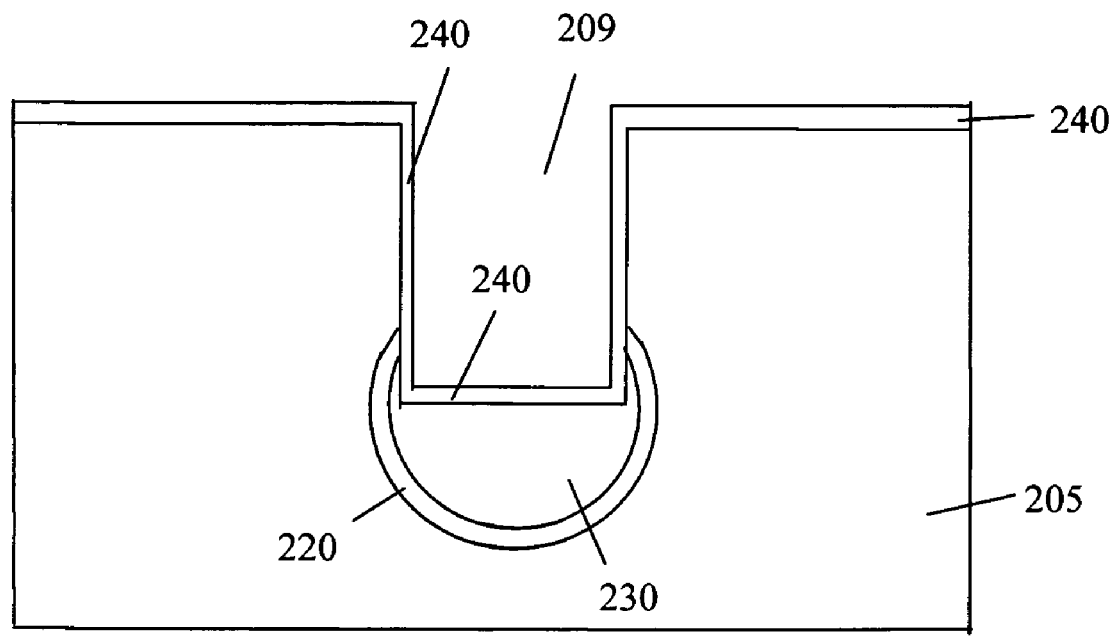
Figure 3I:
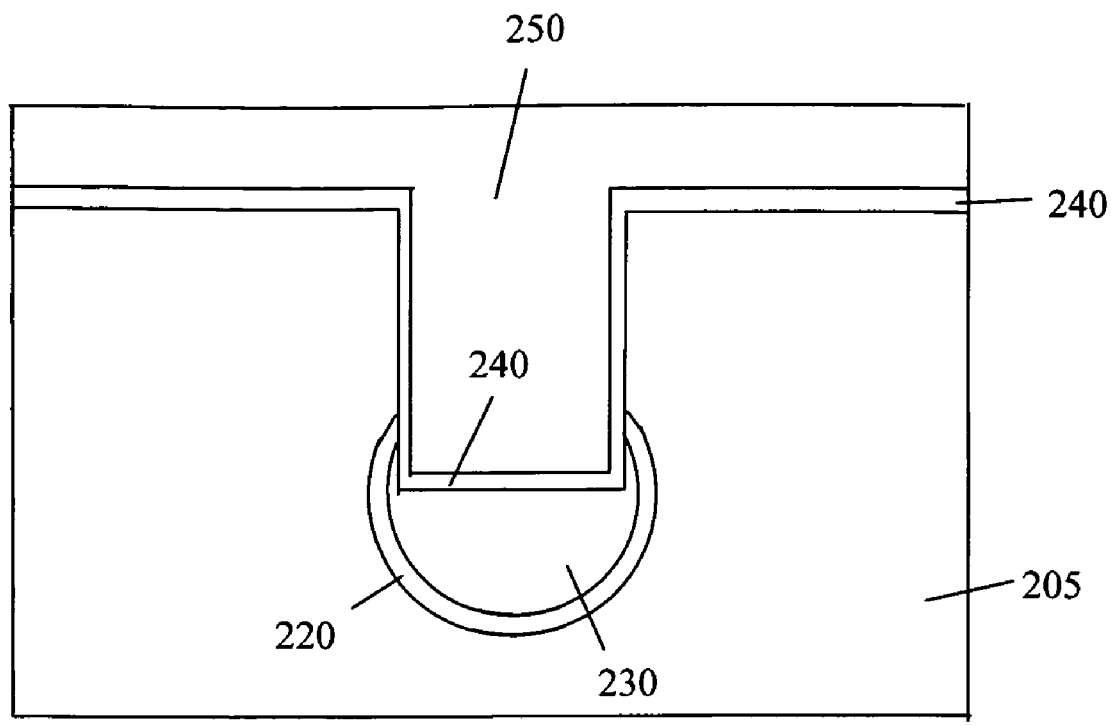
Figure 3J:
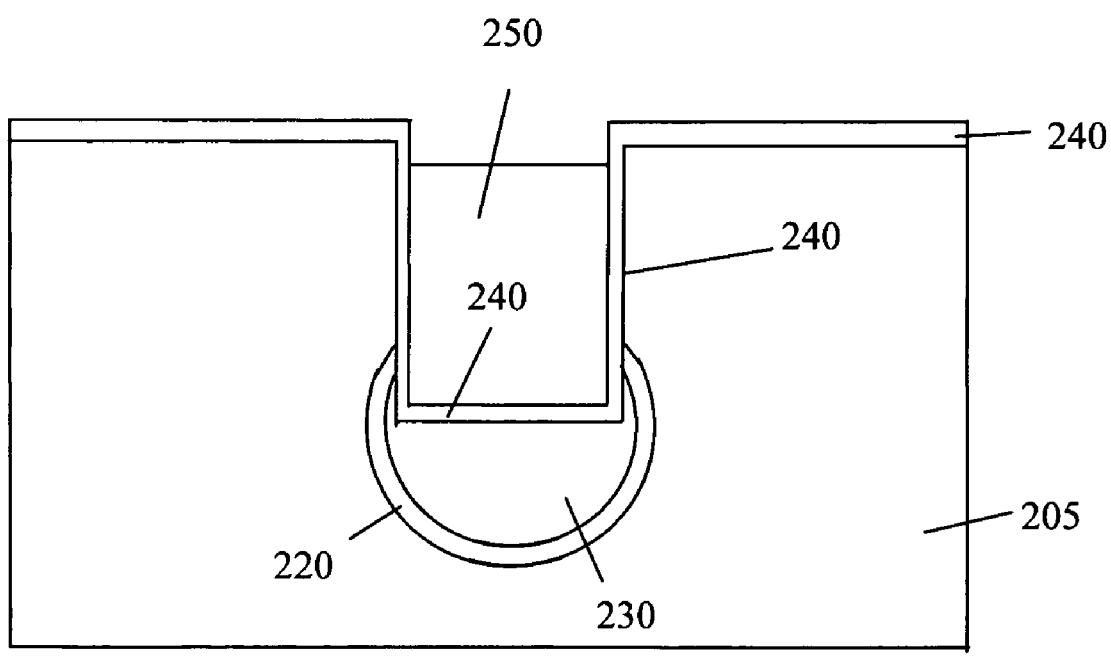
Figure 3K:
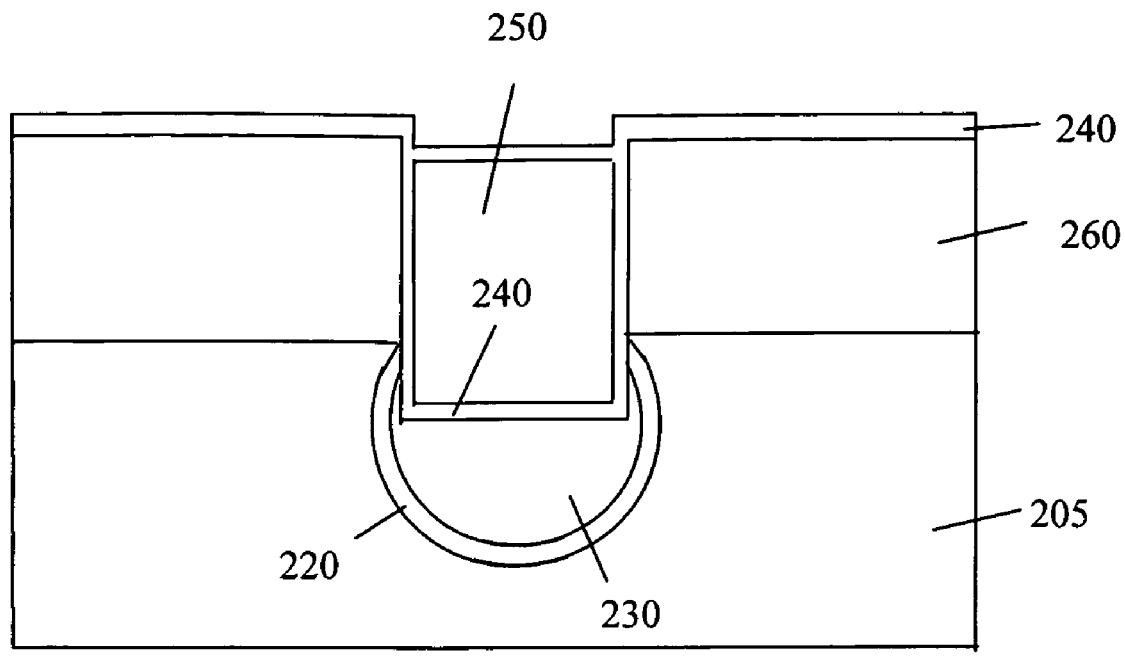
Figure 3L:
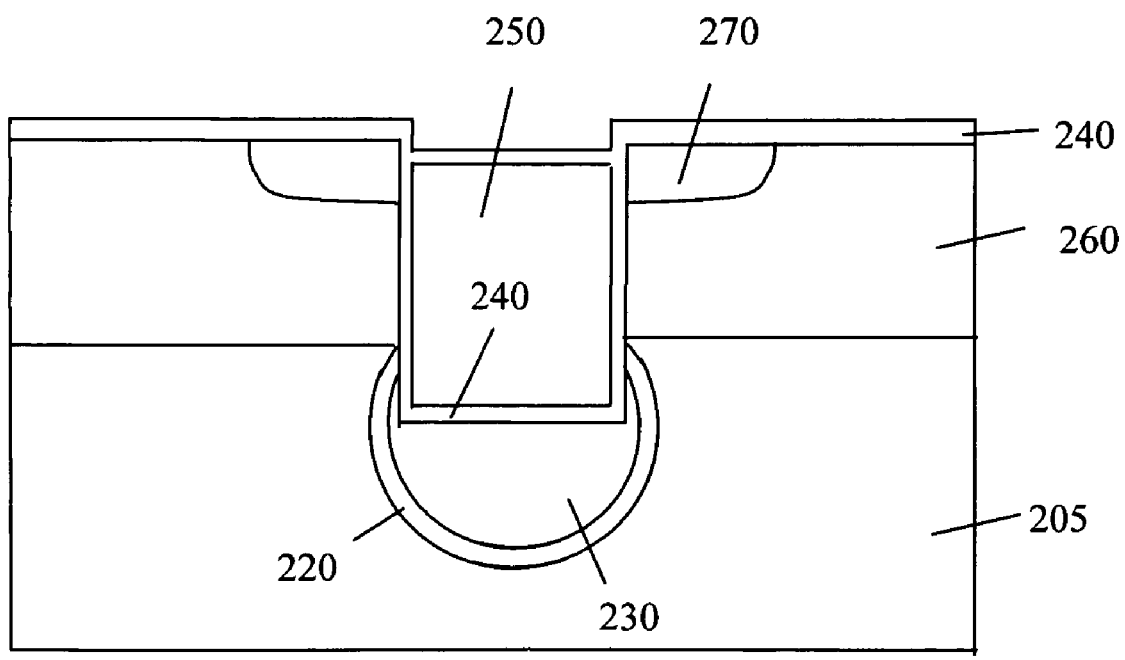

In FIG. 3F, a timed polysilicon etch is performed to remove the polysilicon layer 220 from the top of the trenches 209. The variations of the polysilicon etch back operations in the center of the polysilicon will not influence the device performance or the gate-to-drain capacitance Cgd. The gate to drain capacitance is determined by the upper edge of the bottom polysilicon layer and channel depth. In FIG. 3G, the oxide hard mask 208 is removed followed by a third trench gate oxide oxidation as shown in FIG. 3H to form a gate oxide layer 240 covering the trench walls and the top surface of the bottom round holes 230. In FIG. 3I, a second polysilicon deposition is carried to fill the trenches with a polysilicon layer 250. A top trench poly gate 250 is formed by the second polysilicon etch to etch back the polysilicon layer covering the top surface of the substrate 205 as shown in FIG. 3J. This second polysilicon etch back is identical to a standard process of current art. Then, stand processes of body implant and diffusion processes are carried out to form the P-body regions 260 as shown in FIG. 3K. Then, standard source dopant implant and diffusion processes are carried out to form the source regions 270 as shown in FIG. 3L. These processes are identical to the current standard trench MOS process. The rest of the process such as contact, metal, and passivation are identical to the current art as well.

In the process described above, the depth of trench 209 can be more uniform and accurately controlled since the beginning material is a flat wafer. The following non-isotropic oxide etch removes the oxide layer 210 from the bottom of the trench walls. The point where the oxide layer is removed provides a landmark in vertical direction since in the following isotropic silicon etching processes the upper edge of the bottom expanded trench automatically aligned to this point. This upper edge provides a reference point that controls the bottom gate screening effect rather than the poly etch surface. Compare to the conventional process where the top of the bottom source electrode is controlled by time etch, the process disclosed in this application provides a vertical self alignment configuration with much better accuracy since the structure de-convolutes the depth of gate control point from the less controllable time-etched poly etch back surface to a more precise reference point through self align process.

According to above descriptions, this invention further discloses a method for manufacturing a trenched metal oxide semiconductor field effect transistor (MOSFET) device. The method further includes a step of opening a trench in substrate and covering trench walls of the trench with a liner layer followed by removing a portion of the liner layer from a bottom portion of the trench. The method further includes a step of opening a round hole by applying an isotropic substrate etch on the bottom portion of the trench with the round hole extending laterally from the trench walls. The method further includes a step of filling the trench and the round hole at the bottom of the trench with a gate material followed by applying a time etch to removed the gate material from a top portion of the trench whereby the gate material only filling the round hole up to a lateral expansion point of the round hole. The method further includes a step of controlling the time etch in removing the gate material from the top portion of the trench by applying the lateral expansion point of the round hole as a vertical alignment landmark for controlling a depth of a trenched gate of the MOSFET device. The method further includes a step of forming an insulation layer for covering a top surface of the round hole for separating the round hole from the trenched gate. The method further includes a step of filling a gate material into the trench above the round hole followed by an etch-back process to remove the gate material from a top surface of the substrate to form the trenched gate. The method further includes a step of forming a body region and a source region surrounding the trenched gate.

In essence this invention further discloses a method of manufacturing a semiconductor device. The method includes a step of forming an alignment landmark along a vertical direction of a substrate to provide a measurable control parameter for controlling a manufacturing process to achieve a structural feature with a predefined vertical alignment. The method further includes a step of opening a trench with a controllable depth. In a specific embodiment, the method further includes a step of forming an alignment landmark along a vertical direction of a substrate to provide a measurable control parameter for controlling a manufacturing process to achieve a structural feature with a predefined vertical alignment. The manufacturing process further includes a step of opening a trench with a controllable depth. The step of forming the landmark for vertical alignment comprising a step of opening a round hole in the trench with a lateral expansion beyond a trench wall for providing the landmark for vertical alignment. The step of forming the round hole in the trench further comprising a step of forming a round hole in a bottom of the trench and filling the round hole with a gate material to function as a shielded gate trench (SGT) structure. The step of forming the round hole is a step of applying an isotropic substrate-etch to open a round hole in a bottom of the trench. The method further includes a step of forming an insulation layer on top of the round hole filled with the gate material to form the SGT structure as an insulated structure from the trench. The method further includes a step of filling the trench with the gate material and etch back the gate material from a top surface of the trench for forming a trenched gate in the trench with the SGT structure disposed in the round hole below the trenched gate. The method further includes a step of forming a body region and a source regions in the substrate surrounding the trenched gate for manufacturing a MOSFET device step of forming the landmark for vertical alignment comprising a step of opening a round hole in the trench with a lateral expansion beyond a trench wall for providing the landmark for vertical alignment.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A method for manufacturing a trenched metal oxide semiconductor field effect transistor (MOSFET) device comprising:
    opening a trench in substrate and covering trench walls of said trench with a linen layer followed by removing a portion of said linen layer from a bottom portion of said trench;
    opening a round hole by applying an isotropic substrate etch on said bottom portion of said trench with said round hole extending laterally from said trench walls; and
    filling said trench and said round hole at the bottom of said trench with a gate material followed by applying a time etch to removed said gate material from a top portion of said trench whereby said gate material only filling said round hole up to a lateral expansion point of said round hole.

2. The method of claim 1 further comprising:
    controlling said time etch in removing said gate material from said top portion of said trench by applying said lateral expansion point of said round hole as a vertical alignment landmark for controlling a depth of a trenched gate of said MOSFET device.

3. The method of claim 2 further comprising:
    forming an insulation layer for covering a top surface of said round hole for separating said round hole from said trenched gate.

4. The method of claim 3 further comprising:
    filling a gate material into said trench above said round hole followed by an etch back process to remove said gate material from a top surface of said substrate to form said trenched gate.

5. The method of claim 4 further comprising:
    forming a body region and a source region surrounding said trenched gate.

6. A method of manufacturing a semiconductor device comprising a step of:
    forming an alignment landmark along a vertical direction of a substrate to provide a measurable control parameter for controlling a manufacturing process to achieve a structural feature with a predefined vertical alignment;
    opening a trench with a controllable depth;
    said step of forming said landmark for vertical alignment comprising a step of opening a round hole in said trench with a lateral expansion beyond a trench wall for providing said landmark for vertical alignment; and
    said step of forming said round hole in said trench further comprising a step of forming a round hole in a bottom of said trench and filling said round hole with a gate material to function as a shielded gate trench (SGT) structure.

7. The method of claim 6 wherein:
    said step of forming said round hole is a step of applying an isotropic substrate etch to open a round hole in a bottom of said trench.

8. The method of claim 7 further comprising:
    forming an insulation layer on top of said round hole filled with said gate material to form said SGT structure as an insulated structure from said trench.

9. The method of claim 8 further comprising:
    filling said trench with said gate material and etch back said gate material from a top surface of said trench for forming a trenched gate in said trench with said SGT structure disposed in said round hole below said trenched gate.

10. The method of claim 9 further comprising:
    forming a body region and a source regions in said substrate surrounding said trenched gate for manufacturing a MOSFET device.

* * * * *